Oct. 20, 1964 C. B. ACKERMAN 3,153,750

SEMICONDUCTOR DEVICE WITH TWO-PIECE SELF-JIGGING CONNECTORS

Filed Jan. 19, 1961 2 Sheets-Sheet 1

INVENTOR.
Charles B. Ackerman
BY Mueller & Aichele
Attys.

SEMICONDUCTOR DEVICE WITH TWO-PIECE SELF-JIGGING CONNECTORS

Filed Jan. 19, 1961 2 Sheets-Sheet 2

INVENTOR.
Charles B. Ackerman
BY Mueller & Aichele
Attys

United States Patent Office 3,153,750
Patented Oct. 20, 1964

3,153,750
SEMICONDUCTOR DEVICE WITH TWO-PIECE SELF-JIGGING CONNECTORS

Charles B. Ackerman, Phoenix, Ariz., assignor to Motorola, Inc., Chicago, Ill., a corporation of Illinois Filed Jan. 19, 1961, Ser. No. 83,795
7 Claims. (Cl. 317—234)

This invention relates to semiconductor devices and more particularly to power transistors and methods of assembly therefor. This application is a continuation-in-part of copending application Serial No. 767,137, filed October 14, 1958.

In order to broaden the electronic applications of semiconductor devices, it has been necessary to extend the current and voltage handling capabilities of power transistors. The design of power transistors for use at high current levels in the order of 10 to 15 amperes involves certain problems not encountered in the design of units operating at lower current levels. One problem is to provide a semiconductor die unit having electrodes which can handle and provide a current capacity in this amount. Another problem is the necessity for providing conductive means at such die unit as well as for the complete device capable of handling very high emitter currents. A still further problem is the possible breakage of the die in the semiconductor die unit fused to large area metal connections when there is expansion and contraction induced by temperature change during the operation of the device.

These problems must be solved from a structural and operating standpoint, and yet it is essential in order to have a competitive device, that the transistor elements are of a design to be as inexpensive as possible, and that the structure as a whole be capable of quick and easy assembly with accurate self-jigging so as to minimize labor costs.

The problems enumerated above which are common to power transistors with a current handling rating of generally 10 amperes or below have been very satisfactorily solved in the specific embodiment illustrated and described in the copending applications of Dale T. Kelley, Serial No. 551,498, filed December 7, 1955, and Serial No. 847,735, filed October 21, 1959, which is a continuation of abandoned application Serial No. 611,840, filed September 25, 1956, and the improvements thereover in the present application are particularly adapted to a power transistor with a current handling rating of 10 amperes, and above, although the present embodiment also utilizes the invention of that application.

It is an object of the present invention to provide a power transistor structure adapted for operation at high voltage and high current levels while at the same time being capable of quick and accurate self-jigging assembly.

It is a further object of the invention to provide a power transistor operable at high power levels employing relatively heavy emitter currents and incorporating a large-area connection to the semiconductor die unit with a minimum danger of fracture of the unit as a result of temperature changes.

It is another object of the invention to provide a compact power transistor suitable for flush mounting on a flat surface so as to obtain the maximum heat transfer from the transistor, and yet accomplish this result in a device which can be mounted quickly and securely.

It is yet another object of the invention to provide a practical and economical process for assembling power transistor units.

A feature of the present invention is the provision in a power transistor of a pair of clip members made of different materials to provide optimum electrical contact conditions to an annular or ring emitter and to a ring base on a semiconductor die, but adapted for interlocking engagement to facilitate the self-jigging assembly of the transistor in the same general manner as a one-piece member.

A further feature of the invention adapted to a power transistor having an annular emitter contact or electrode positioned on one side of a semiconductor die between two base contacts or electrodes is the provision of a complex connecting means for the contacts or electrodes which becomes simple for handling purposes and is stamped out by inexpensive dies as two pieces rather than as a single complex member. One piece is of a metal having substantially the same thermal coefficient of expansion as the die, while the other piece is of highly conductive metal for the best possible electrical conductivity from its corresponding electrode.

Another feature of the invention is the provision of a pair of generally V-shaped connecting clip members for connection to the semiconductor unit and which fit over and rest on flanges of feedthroughs of a transistor structure. Each of the clips has an end portion making contact with the semiconductor die unit and also has a portion which overlaps and interlocks with the other clip to facilitate their mutual alignment during the self-jigging assembly of the transistor.

Another feature is the provision of a member serving as a mount for the transistor elements in combination with gas inlet and sealing structure which makes for a simple closure without interfering with the most effective mounting for the transistor.

A still further feature of the invention is the provision of an interrupted annular guard ring integral with the base or mounting structure of a power transistor which facilitates the positioning of a welding ring on the mounting structure and the subsequent alignment of a cover member for welding to such ring.

Still another feature of the invention is a method of assembling a power transistor by positioning on feedthrough flanges independent clip or connector members of different material which are interlocked and maintained in position until fused to the feedthroughs, heating the assembly to make fused electrical connections from the semiconductor unit, and then severing the locked connection between the clip members to eliminate what would otherwise be an electrical short through them.

Figure 10:
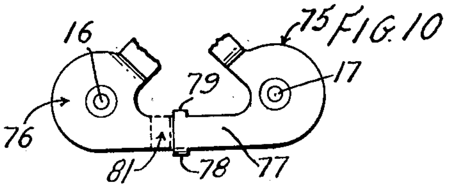
Figure 10A:
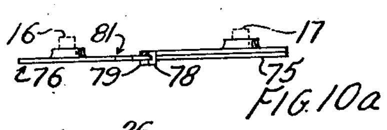
Figure 11:
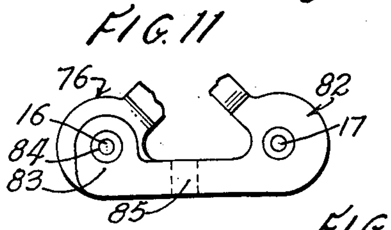
Figure 11A:
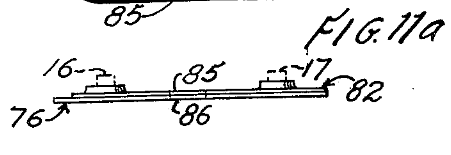
Figure 5:
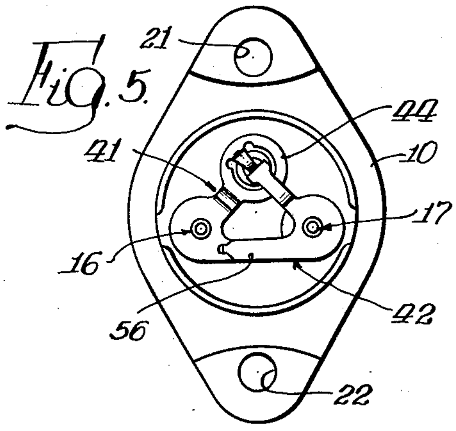
FIG. 5 is a plan view of a transistor unit in a partially assembled state prior to removing by cutting what would be short circuits between the emitter and base contacts or electrodes.
Figure 6:
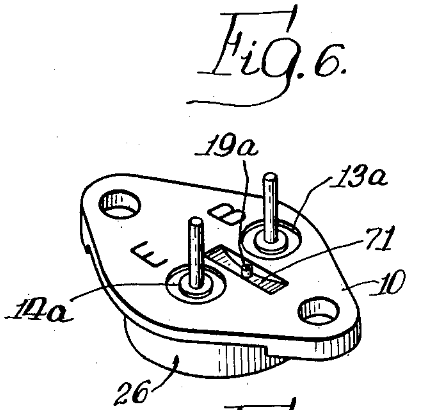
FIG. 6 is a bottom view of a partially completed transistor showing the disposition of an exhaust vent on the underside of the base, with a cap or covering on the same so it will not be damaged.
Figures 6A, 7, 8, 8A, 9:
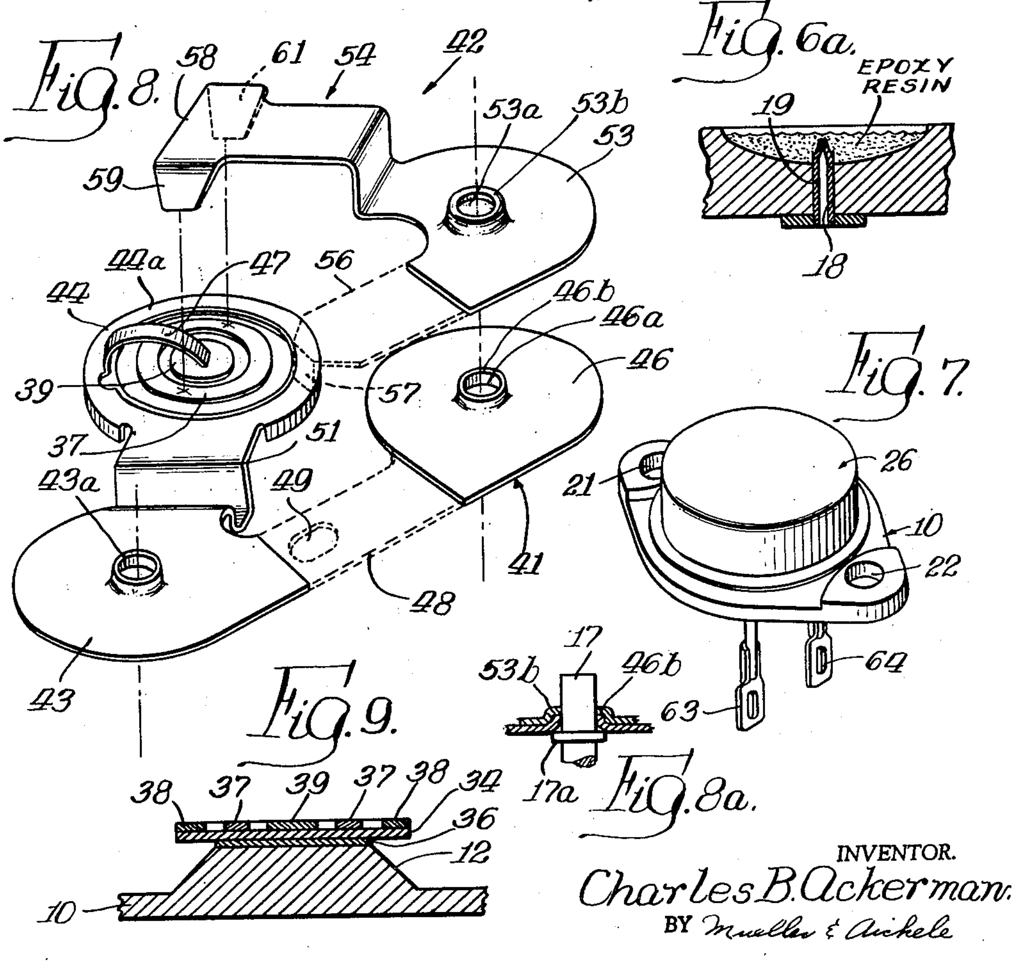

FIG. 6*a* is an enlarged fragmentary view showing the exhaust vent crimped for closure and covered for protection by epoxy resin as an alternative to capping;

FIG. 7 is a perspective top view of a completed transistor in accordance with the present invention;

FIG. 8 is a greatly enlarged perspective view showing the details of the clip structures used in the present invention with severable portions of the clips shown in dotted lines;

FIG. 8*a* is a view illustrating the nesting or telescoping fit of the boss portions of the clip structures when they are in place;

FIG. 9 is a greatly enlarged cross-sectional view taken through the semiconductor die unit of the present invention as it is mounted on a pedestal;

FIGS. 10 and 10*a* are fragmentary enlarged plan and side views respectively of modified clip or connector members from the clip or connector structure illustrated particularly in FIGS. 5 and 8; and FIGS. 11 and 11*a* are fragmentary enlarged plan and side views respecticvely of still further modifications of the stacked or interrelated clip or connector members.

A power transistor in accordance with the invention includes a semiconductor die having a collector electrode on one side, and an annular emitter and annular and central base contacts or electrodes on the other side. The die is mounted with its collector side secured to a raised portion on the mounting base of the device. Electrical and mechanical connection to the emitter and base are made to upright feedthroughs through a pair of conductive clip members. One of the clip members is made of highly conductive material such as copper, and has a bifurcated contact arm secured to the ring emitter. The other clip member is connected to the annular base electrode at a rim portion, and to the central base contact by a tab fitting between the legs of the bifurcated contact arm of the emitter clip member. This base clip is made of a less conductive material such as steel or a metal alloy having essentially the same thermal coefficient of expansion as the semiconductor material making up the die. The two clips are essentially V-shaped and are provided with arm portions of a structure to overlap and to be maintained in substantially fixed position with one another during the assembly of the device while the clips rest on flanges of the feedthroughs. The interrelation of the two dissimilar metal clips assist in their alignment with respect to one another, and assures accurate alignment of their contact arms with respect to the semiconductor die and its electrodes or contacts. Fusible metal is provided at the junctions in the unit to be fused, and the assembly is passed through a single furnace to heat the fusible metal and make mechanical and electrical connection wherever required. After the clips are fused to the feedthroughs and hardened at the fusing so as to be rigid, a portion or portions of the clips are severed and removed so as to eliminate the electrical connection between the emitter and base contacts or electrodes.

Figure 1:
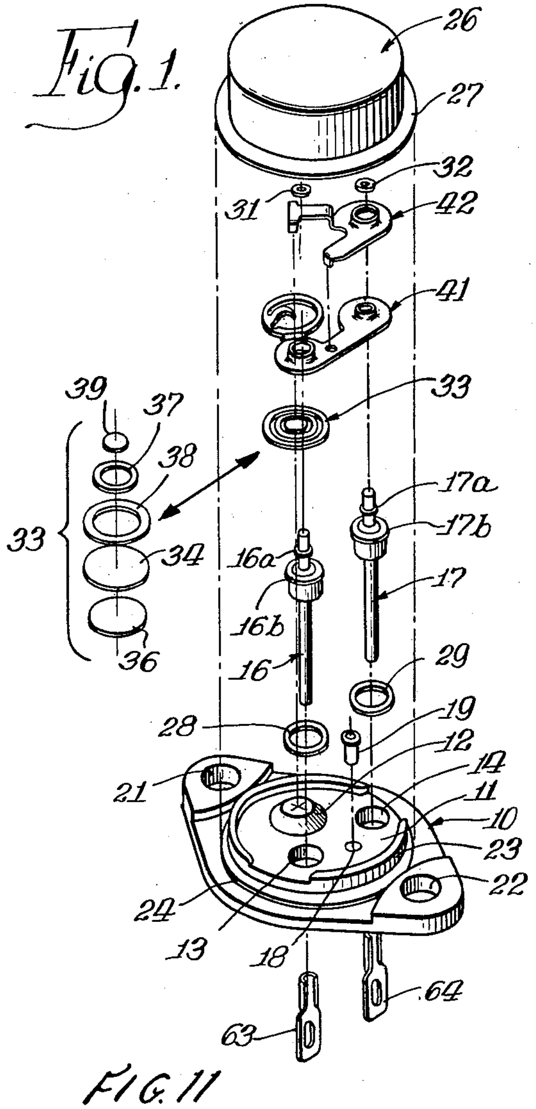
FIG. 1 is an exploded perspective view showing the various parts of a power transistor in accordance with the present invention with such parts shown at actual size for one embodiment.

FIG. 1 is an exploded perspective view of a transistor in accordance with the present invention and is the actual size of a particular embodiment. The unit includes a generally diamond-shaped mounting base 10 stamped or otherwise formed from copper, or a similar metal of good heat conducting properties. The mounting base 10 includes a raised central platform or island portion 11 generally circular in shape which has a frusto-conical pedestal 12 positioned thereon. Openings 13 and 14 are provided in the mounting base to accommodate the feedthroughs 16 and 17 respectively, while the opening 18 is provided for the vent 19, the function of which will be bore fully explained subsequently. The corners of the mounting base are also provided with openings 21 and 22 to accommodate suitable mounting bolts or the like.

Figure 3:
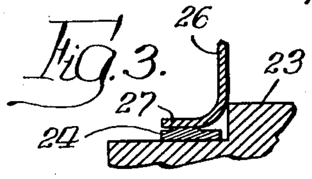
FIG. 3 is a detail view in cross-section illustrating the mounting of a protective cover for the transistor.

The central portion of the mounting base 10 is surrounded by a substantially annular guard ring 23 which is interrupted adjacent the openings 13 and 14 to provide adequate space for the flange of each feedthrough and not interfere with positioning of the same in the openings. A steel weld ring 24 fits around the guard ring 23 and is brazed or silver-soldered to the surface of the mounting base 10. The cover member 26 has a lip portion 27 welded to the weld ring as shown in FIG. 3.

Each of the feedthroughs 16 and 17 is cold-headed to provide retaining flanges **16*a* and 17*a* respectively, and as will be explained, the pin or post for the unit 16 is connected to base contacts as illustrated in the present drawings, and the pin or post for the unit 17 is connected with the annular emitter of the die assembly. The feedthroughs are also provided with metal cups having shoulder portions or flanges 16*b* and 17*b* respectively which overhang the periphery of the openings 13 and 14 when they are in place. A glass insulating member is sealed to the elongated pin portion of each feedthrough. As will be subsequently explained, the solder rings 28 and 29 are pjrovided around the openings 13 and 14 and underneath the flanges 16*b* and 17*b* to secure the feedthroughs to the mounting base. Likewise, the solder preforms 31 and 32 are adapted to be threaded over the tops of the pins for the feedthroughs 16 and 17** respectively after the clip members are in place.

The transistor includes a semiconductor die unit 33 which is shown in a bracketed exploded view and includes the germanium die 34 having a pair of opposed faces or sides. An indium collector electrode or contact 36 is alloyed to one face and the annular indium emitter electrode or contact 37 is alloyed to the other face. A first annular base contact or connection 38 in the form of an antimony-lead solder ring extends around the periphery of the die 34 outside of the emitter electrode 37. A second base contact or connection to the die 34 is provided centrally by the antimony-lead solder body 39 which fits within the annular emitter 37. The semiconductor unit 33 is fused into one assembly prior to assembling it with the remaining parts of the transistor, as will be explained. This is shown in FIG. 1.

Connections from the base and the emitter electrodes of the semiconductor unit 33 are made to the posts of the feedthroughs 16 and 17 through the base clip 41 and the emitter clip 42. Each of these members is illustrated in FIG. 8 on a magnified scale for the sake of clarity with the arm portions which are removed to complete the assembly process being shown in dotted lines.

Figure 2:
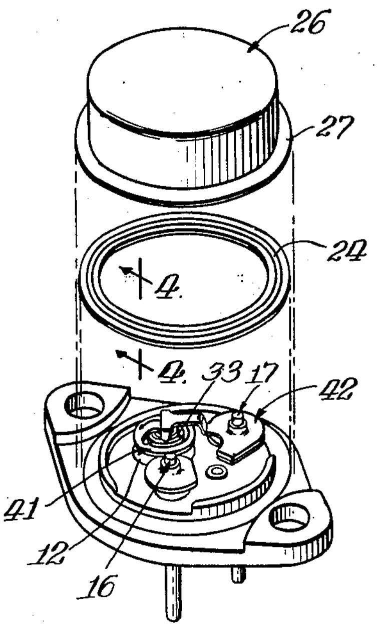
FIG. 2 is an exploded perspective view showing a partially completed transistor also on the same scale as an actual unit.

The base clip 41 is made of a nickel-steel alloy having substantially the same thermal coefficient of expansion as the germanium die 34. The clip is generally V-shaped in configuration and includes the apex portion 43 and the arm or end portions 44 and 46 extending therefrom. The end portion 44 is generally annular in configuration having the rim **44*a* which is adapted to fit against the annular base electrode 38 on what is the top face in FIGS. 1, 2 and 5, while an annular downturned flange, shown particularly in FIG. 8, surrounds the outside edge of the die unit 33. The tab 47 particularly shown in FIG. 8, is adapted to establish connection to the central base contact or electrode 39. The apex 43 and the end portion 46 are joined by a severable arm portion 48 which has an aperture 49 formed therein. The aperture 49 receives an interlocking tongue from the clip 42 as will be explained. The apex 43 is provided with an opening 43*a* and the end portion 46 has an opening 46*a***. The crimped arm portion 51 connects the apex portion 43 with the end portion 44, and is provided to take up expansion and contraction in the clip member if needed to minimize the danger of breakage of the die unit. The clip 41 is covered with a very thin gold layer so that fluxless soldering may be accomplished simply by applying heat during assembly.

The emitter clip member 42 is likewise generally V-shaped, having an apex portion 53 provided with an opening 53*a* and arm portions 54 and 56. The arm portion 56 can be cut from the rest of the clip after assembly of the internal transistor structure, and includes a bent tongue 57 adapted to fit into the opening 49 of the base clip 41. The arm portion 54 has a bifurcated contact portion 58 with integral legs 59 and 61 which are adapted to fit against the annular emitter electrode 37 when the device is assembled. Because the transistor of the present invention is particularly adapted to high current and high voltage operation, it is necessary that the emitter carry a relatively high current of the order of 10 amperes. For this reason the emitter clip 42 is made of a highly conductive metal, preferably copper. If the emitter clip 42 were made of the same nickel-steel alloy used for the base clip 41 it might melt under the high current it is required to carry. On the other hand, if base clip 41 were made of copper there would be substantial differential in expansion between it and the die 34 when temperature changed, and the die in the die unit to which the clip is secured might crack. Inasmuch as this connector carries a relatively small current, conductivity is not as important as for the clip member 41. Like the base clip 41, however, the emitter clip 42 is covered with a thin coating of gold in order to facilitate fluxless soldering.

Accordingly, the high electrical conductivity is satisfied in the copper connector 42 going to the emitter electrode, and the desired coefficient of contraction and expansion for mechanical reasons is accomplished by the nickel-steel alloy of the connector 41. At the same time a self-jigging connector structure for a somewhat complex contact or electrode system is provided in the two interlocked but severable clip member construction.

Returning now to FIG. 1, each of the feedthroughs 16 and 17 extends through the mounting base 10 when the transistor is assembled. The pin or post portion of each is provided with a solder lug 63, and 64 respectively, at the ends thereof to facilitate the making of base and emitter connections to a circuit in which the transistor is connected.

One of the principal advantages of the present invention is the ease with which the transistor unit may be assembled without the use of external jigging devices. In the assembly of the unit, solder rings 28 and 29 are placed on the top surface of the base 10 adjacent the openings 13 and 14. The feedthroughs 16 and 17 are placed through the solder rings 28 and 29 and within the openings 13 and 14 of the mounting base 10. The flanges or shoulders 16*b* and 17*b* of the respective feedthroughs are of a diameter such as to hold the feedthroughs within the openings.

The semiconductor die unit 33 is assembled independently in an alloying furnace by means forming no part of the present invention. In the embodiment shown, the germanium die 34 is of n-type conductivity with the collector and emitter electrode members 36 and 37 respectively being of indium so that when they are alloyed to the germanium they form a recrystallized region of p-type material, thus creating the desired rectifying junctions. The annular base contact 38 and the central base contact 39 are of an antimony-lead solder and form ohmic connections to the surface of the germanium die 34.

Continuing the assembly; the clip 41 is placed on the flanges 16*a* and 17*a* with the pin portions of the feedthrough 16 and 17 extending through the openings 43*a* and 46*a* in the clip and the end portion 46 resting on the pedestal 12. The operator places the die unit 33 under and within the annular portion 44, positioned by the downward flange on such portion, and resting on the pedestal 12. The size of the opening defined by the rim portion 44*a* is such that the die unit may be inserted readily and yet it is held in a proper position on the pedestal until fusing. At the same time, the arm 47 makes contact with the central base contact 39 as shown in FIG. 8, so that the die unit is held in the desired position and the clip member 41 is maintained fixed by the pins 16 and 17. The positions of the contacts on the die unit are shown more clearly in FIG. 9.

The emitter clip 42 is now superimposed upon the base clip 41 by placing the clip with the upper end of feedthrough 17 within the opening 53*a*, and by letting the clip drop onto the apex portion 46. The two clip members are interlocked by the tongue 57 dropping into the opening 49. In this position the openings 46*a* and 53*a* are aligned with one another. Because of the difficulty of completely illustrating the positioning of clip 42 on clip 41 and the exact shapes and relative sizes of bosses 46*b* and 53*b* in the other figures, FIG. 8*a* is provided. This shows how the boss 53*b* fits over the boss 46*b*. As best shown in this figure, boss 53*b* is larger than boss 46*b* to provide the nesting or telescoping effect illustrated, and it has an inturned flange fitting over the top of boss 46*b*. The portions 43 and 46 of the clip member 41 rest on the flanges 16*a* and 17*a*.

Solder rings 31 and 32 are placed over the respective pins and drop down onto the one clip at 43*a* and onto the other at 53*a*. In this position of the parts, the bifurcated contact member 58 fits over the tab 47 of the base clip, and the legs 59 and 61 rest against the annular emitter 37. When the connector is soldered thereto, there is an excellent electrical contact.

The device at this stage of the assembly is shown in plan view of FIG. 5. The interlocked clips 41 and 42 are now properly aligned with respect to one another and held in alignment by the pins of the feedthroughs with the solder preforms 31 and 32 on top of the clip portions. This is all accomplished without the aid of external jigs, and the dimensions of all parts and openings are such that the operator was able to quickly assemble them in this position.

The self-jigged structure with the clip members in a position to drop or settle down is now passed only once through a suitable heating furnace at a temperature to melt the solder preforms and to fuse the clip members to the base and emitter electrodes. Simultaneously the feedthroughs ar soldered in place within openings 13 and 14, and the collector electrode is fused to the pedestal 12.

As shown in FIG. 6, the bottom surface of the mountiing base 10 is provided with counterbores 13*a* and 14*a* around the openings 13 and 14 respectively. Excess solder flowing down through the openings adheres to the walls of the counterbores, and thus does not run down to the bottom surface of the base. Accordingly, no excess solder will interfere with the flatness of the bottom surface, and a tight and flush physical conection can be made when mounting the transistor on a heat sink.

Subsequent to this soldering step, the severable portions indicated by the references 48 and 56 in FIG. 8 which have been interlocked for the purpose for alignment are clipped out with cutter pliers or the like in order to eliminate the electrical connection between the clips 41 and 42. At this stage of the assembly process, the unit has the configuration illustrated in assembly at the bottom of FIG. 2.

In the modified connector members shown in a fragmentary manner in FIGS. 10 and 10*a*, the essential difference is that the tongue and aperture connections of FIGS. 5 and 8 is replaced by a member 75 in a V-shape with a leg portion 77 having a pair of downwardly extending prongs 78 and 79. The prongs are identical to one another and slip over the sides of the connector member 76, which is the same as member 41 in FIG. 8 except at this overlapped portion. With the member 76 maintained on the posts 16 and 17 as explained for member 41, the connector member 75 positioned over the post 17 is maintained against rotary motion relative to such post 17 and the semiconductor die unit by the overlapping and the prongs at the respective corresponding sides of the member 76.

With practical tolerances for the interrelated portions of the members 75 and 76 they are assembled readily as the semiconductor device is put together, and the position of each with respect to the semiconductor unit 33 is satisfactorily maintained without any independent jigging during the fusing step; as explained with reference to principal embodiment.

Another modification of the clip or connector members only is also illustrated in a fragmentary manner in FIGS. 11 and 11*a*. The member 76 is positioned on the posts 16 and 17 and in contact with the semiconductor unit 33 in the same mannner as for the structure of FIG. 10, and in the same manner as for the base clip or connector-member 41 (FIGS. 5 and 8). The emitter clip or connector 82 is of V-shape and corresponds exactly with the member 42 except for the portion extending away from the post 17. The latter portion overlaps a corresponding portion of the member 76 and has an extension 83 which is apertured at 84 to fit over the post 16. Accordingly, the members 76 and 82 of FIGS. 11 and 11*a* each have a stacked or overlapped portion, which are interrelated and maintained abainst movement relative to one another and the semiconductor unit 33. In the assembly thereof they are dropped into position over the posts 16 and 17, and are maintained substantially during subsequent steps of manufacture as described for the principal embodiment.

In each of the two modifications of the clip or connector members, the same solder preforms and the same steps for assembly and fusing or soldering are employed as have been described for the principal embodiment. Furthermore, after the pieces are all fused or soldered in position and the connections are hardened, the connector structure is severed by clipping or burning, and the short circuit or possibility or short circuit in the connections is removed as originally described. In FIG. 10, dotted lines indicate diagrammatically a portion 81 where the severing can take place, and even though just one of the two members is acted upon, the effect is the same as for the severing at 48 and 56 in FIG. 8.

In FIGS. 11 and 11*a* the dotted lines at corresponding portions 85 and 86 diagrammatically illustrate areas for severance in both member 82 and 76 respectively.

Figure 4:
FIG. 4 is a view in section taken on the line 4—4 of FIG. 2.

It is desired to enclose the electrically operative portion of the unit in order to protect it from dust, mechanical disturbance and the like, and also to surround it with a suitable protective atmosphere. To accomplish this, a weld ring 24 preferably made of steel, is dropped outside the guide ring 23 which assists in centering it, and the ring 24 is brazed or silver-soldered to the copper mount 10. As shown in FIG. 4, the weld ring is provided with a raised annular ridge portion 24*a*. The cover 26 is then dropped into position, and is guided by the guide ring 23 so that its turned-out lip 27 falls onto the ridge 24*a*. The cover is then welded into place to form the joint illustrated in FIG. 3. During this operation the guide ring 23 serves to protect the operative portion of the transistor from weld flash.

The vent 19 extends through the opening 18 in the mounting base 10, nad is silver-soldered thereto at the same time weld ring 24 is attached. The vent is connected to a suitable gas source which is alternately forced into and withdrawn from the space enclosed by the cover 26 to provide a flushing action until all moist or corrosive gases have been removed, and then the space is filled with a dry protective atmosphere such as nitrogen. Following this, the end of the vent 19 is pinched shut and metal cap 19*a* is soldered over it (FIG. 6), or as shown in FIG. 6*a*, the recess 71 is filled with epoxy resin. The lower flat surface of the base 10 is provided with the recess 71 to accommodate the end of the vent 19, and the cap 19*a*, or the epoxy resin covering the same. This enables the power transistor to be mounted flush on a flat heat sink which contains suitable openings to accommodate the feedthroughs 16 and 17.

Following the sealing of the unit the solder lugs 63 and 64 are connected to the ends of the feedthroughs 16 and 17 respectively so that appropriate connection to circuit elements can be made through them.

The present invention thus provides a power transistor capable of operating at high voltages and high currents and employing the most appropriate materials for the making of base and emitter connections. At the same time the provision of the connector clips with one portion of each overlapping and positioned relative to one another in a substantially fixed position relative to the semiconductor die unit during assembly and soldering provides for inexpensive stamped pieces that individually can have complex shapes, but which all together provide the advantages of a self-jigging structure with resulting savings in costs of production and in ruggedness of design.

I claim:

1. In a semiconductor device having a mounting base portion with first and second upstanding pins thereon and having a semiconductor die with at least first and second electrical contacts on one face of said die, the combination including a first electrical connector member electrically connected to said first upstanding pin and to said first contact and forming a relatively large area first connection therewith, said first connector member being of a material of substantially the same thermal coefficient of expansion as the semiconductor material of said die in order to minimize breakage of said die which would occur with a greater differential of expansion and contraction between said die and said first connector member due to said connection between said die and said connector member being a large area connection, a second electrical connector member connected to said second upstanding pin and to said second contact and forming a relatively small area second connection with said second contact, said area of said second connection being small enough to preclude breakage of said die due to any differences in thermal expansion between said die and said electrical connector and said second electrical connector being electrically separate from said first connector member, said second connector member being of a material which has of necessity different physical characteristics than said first connector member, and an extension portion of one of said connector members resting on and interlocked relative to a portion of the other of said connector members thereby forming a mechanical connection between said connector members to serve a self positioning function in the assembly of said device so that in cooperation with said conductive pins said connector members act to maintain said die, said mounting base, and said connector members themselves in proper location for an assembly operation and said mechanical connection between said connector members being physically and electrically open in the final condition of said device.

2. In a semiconductor device having a mounting base portion with first and second upstanding pins thereon and having a semiconductor die with at least first and second electrical contacts on one face of said die, the combination including a first electrical connector member electrically connected to said first upstanding pin and to said first contact and forming a relatively large area first connection therewith, said first connector member being of a material of substantially the same thermal coefficient of expansion as the semiconductor material of said die in order to minimize breakage of said die which would occur with a greater differential of expansion and contraction between said die and said connector member being a large area connection, a second electrical connector member connected to said second upstanding pin and to said second contact and forming a relatively small area second connection with said second contact, said area of said second connection being small enough to preclude breakage of said die due to any differences in thermal expansion between said die and said electrical connector and said second electrical connector being electrically separate from said first connector member, said second connector member being of a material which is a better electrical conductor than said first connector member and adapted to accommodate a higher level of current conduction therethrough than in the first connector member, and an extension portion of one of said connector members resting on and interlocked relative to a portion of the other of said connector members thereby forming a mechanical connection between said connector members to serve a self positioning function in the assembly of said device so that in cooperation with said conductive pins said connector members act to maintain said die, said mounting base, and said connector members themselves in proper location for an assembly operation and said mechanical connection between said connector members being physically and electrically open in the final condition of said device.

3. In a semiconductor device having a mounting base with a pair of pins upstanding from one surface and a semiconductor die unit supporting area on such surface spaced from each pin, the combination including a semiconductor die unit on said supporting area having an electrode portion on one side thereof in contact with said base at said area and said die unit having a pair of concentric ring electrodes on the other side thereof and a center electrode within the innermost of said ring electrodes, and connecting means from said die unit to said pair of pins consisting of two one-piece metal connector members, with one of said connector members having an apertured portion fitting over one of said pins, having an enlarged portion in contact with the outer ring electrode and having a pronged portion in contact with the center electrode, the other of said connector members having an apertured portion fitting over the other said upstanding pin and having a portion with extensions thereon in contact with the inner ring electrode but out of electrical connection with the first connector member, with one of said two metal connector members having a portion overlapping a corresponding portion of the other member and originally being interconnected during a part of the time in the total manufacture of the device to assist in positioning said members on the mounting base, and solder material at the juncture of each pin and corresponding metal connecting member to rigidly secure said members to the pins.

4. In a power transistor having a semiconductor element with at least a central base contact, an annular base contact and an annular emitter contact thereon, the combination including a first connector member having a projecting portion electrically connected to said central base contact and having an annular rim portion electrically connected to said annular base contact, and a second connector member having a bifurcated portion thereon fitting over and spaced from said annular rim portion of said first connector member and electrically connected to said emitter electrode, and said two connector members originally in the manufacture of the power transistor having an interrelated projecting portion and receiving portion respectively to assist in positioning said members relative to the semiconductor element so as to provide predetermined connections with said contacts thereon.

5. In a semiconductor device having a semiconductor unit therewith including a semiconductor die unit with a single contact portion on one side of said die unit and on the other side having a pair of concentric ring contact portions and a center contact portion within one of said ring contact portions, the combination of a metal mounting base with a central mounting area defined by a curved ridge portion, said single contact portion of said semiconductor die unit in electrical and mechanical connection with the metal mounting base within said control mounting area, a pair of conductor members within said area and spaced and insulated from said metal mounting base, a connector means from one of said conductor members having a stepped pronged terminal engaging the inner concentric ring contact portion, a second connector means from the other conductor member with a terminal portion having an annular contact for the outer one of said pair of concentric ring contact portions and an integral tongue connected to the center contact portion on the semiconductor die unit, and closure means at the curved ridge portion of the mounting base and at least over the mounting area defined by said curved ridge portion.

6. In a semiconductor device the combination including (*a*) a semiconductor die having first and second opposed faces, (*b*) first, second, third and fourth metal electrodes on said die, said first electrode on said first face of said die, and said second, third and fourth electrodes on said second face, (*c*) a mounting base of conductive material having a first face to which said first electrode is bonded thereby securing said die to said mounting base, (*d*) first and second conductive pins upstanding from said first face of said mounting base, said pins mounted on said base in insulated relationship to said base, (*e*) a first electrical connector member bonded to said second and third electrodes of said semiconductor die and to said first conductive pin, said first electrical connector member of metal having a coefficient of expansion which is substantially the same as that of the material of said semiconductor die, (*f*) a second electrical connector member bonded to said fourth electrode and to said second conductive pin, (*g*) and an extension portion of one of said connector members initially resting on and interlocked relative to a portion of the other of said connector members thereby forming a mechanical connection between said connector member to serve a self positioning function in the assembly of said device so that in cooperation with said conductive pins said connector members act to maintain said die, said mounting base, and said connector members themselves in proper location for bonding, and said connection between said connector members being physically and electrically open in the final condition of said device.

7. In a semiconductor device the combination including (*a*) a germanium semiconductor die having first and second opposed faces, (*b*) first, second, third and fourth metal electrodes on said die, said first electrode on said first face of said die, and said second, third and fourth electrodes on said second face, (*c*) a mounting base of copper material having a first face to which said first electrode is soldered thereby securing said die to said mounting base, (*d*) first and second conductive pins upstanding from said first face of said mounting base, said pins mounted on said base in insulated relationship to said base, (*e*) a first electrical connector member soldered to said second and third electrodes of said semiconductor die and to said first conductive pin, said first electrical connector member of metal having a coefficient of thermal expansion which is substantially the same as that of germanium, (*f*) a second electrical connector member of copper soldered to said fourth electrode and to said second conductive pin, (*g*) and an extension portion of one of said connector members initially resting on and interlocked relative to a portion of the other of said connector members thereby forming a mechanical connection between said connector member to serve a self positioning function in the assembly of said device so that in cooperation with said conductive pins said connector members act to maintain said die, said mounting base, and said connector members themselves in proper location for bonding, and said connection between said connector members being physically and electrically open in the final condition of said device.

References Cited in the file of this patent

UNITED STATES PATENTS

| | | |
|---|---|---|
| 2,610,290 | Braundoff | Sept. 9, 1952 |
| 2,662,997 | Christensen | Dec. 12, 1953 |
| 2,881,370 | Colson | Apr. 7, 1959 |
| 2,882,462 | Zierdt | Apr. 14, 1959 |
| 2,914,716 | Larrison | Nov. 24, 1959 |
| 2,934,685 | Jones | Apr. 26, 1960 |
| 3,061,766 | Kelley | Oct. 30, 1962 |